United States Patent
Günther et al.

(10) Patent No.: US 9,704,945 B2
(45) Date of Patent: Jul. 11, 2017

(54) CARRIER SUBSTRATE AND METHOD FOR PRODUCING SEMICONDUCTOR CHIPS

(75) Inventors: Ewald Karl Michael Günther, Regenstauf (DE); Andreas Plößl, Regensburg (DE); Heribert Zull, Regensburg (DE); Thomas Veit, Mintraching (DE); Mathias Kämpf, Burglengenfeld (DE); Jens Dennemarck, Regensburg (DE); Bernd Böhm, Obertraubling (DE); Korbinian Perzlmaier, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 82 days.

(21) Appl. No.: 13/984,081

(22) PCT Filed: Feb. 7, 2012

(86) PCT No.: PCT/EP2012/052060
§ 371 (c)(1),
(2), (4) Date: Sep. 19, 2013

(87) PCT Pub. No.: WO2012/110365
PCT Pub. Date: Aug. 23, 2012

(65) Prior Publication Data
US 2014/0008770 A1    Jan. 9, 2014

(30) Foreign Application Priority Data

Feb. 16, 2011  (DE) .................. 10 2011 011 378

(51) Int. Cl.
*H01L 29/06*    (2006.01)
*H01L 25/16*    (2006.01)
(Continued)

(52) U.S. Cl.
CPC ........ *H01L 29/0607* (2013.01); *H01L 25/167* (2013.01); *H01L 29/66128* (2013.01);
(Continued)

(58) Field of Classification Search
CPC ..................... H01L 29/0607; H01L 29/66128
(Continued)

(56) References Cited

U.S. PATENT DOCUMENTS 2,980,810 A    4/1961  Goldey
3,023,347 A    2/1962  Strull
(Continued)

FOREIGN PATENT DOCUMENTS

DE    10 2004 014 940 A1    10/2004
DE    10 2009 007 625 A1    5/2010
(Continued)

OTHER PUBLICATIONS

Kitamura et al. "Optical constants for silica glass from extreme ultraviolet to far infrared at near room temperature." Applied Optics. vol. 46, No. 33 8118-8113. Nov. 20, 2007.*
(Continued)

*Primary Examiner* — Allen Parker
*Assistant Examiner* — Stephen Bradley
(74) *Attorney, Agent, or Firm* — DLA Piper LLP (US)

(57) ABSTRACT

A carrier substrate includes a first major face and a second major face opposite the first major face. A diode structure is formed between the first major face and the second major face, which diode structure electrically insulates the first major face from the second major face at least with regard to one polarity of an electrical voltage.

13 Claims, 8 Drawing Sheets

(51) Int. Cl.
*H01L 29/66* (2006.01)
*H01L 23/60* (2006.01)
*H01L 27/02* (2006.01)
*H01L 27/14* (2006.01)
*H01L 27/15* (2006.01)
*H01L 33/00* (2010.01)
*H01L 33/64* (2010.01)
*H01L 33/38* (2010.01)

(52) U.S. Cl.
CPC .......... *H01L 23/60* (2013.01); *H01L 27/0248* (2013.01); *H01L 27/14* (2013.01); *H01L 27/15* (2013.01); *H01L 33/0079* (2013.01); *H01L 33/382* (2013.01); *H01L 33/641* (2013.01); *H01L 2224/48247* (2013.01); *H01L 2224/49107* (2013.01); *H01L 2224/73265* (2013.01)

(58) Field of Classification Search
USPC .......................................... 257/629; 438/113
See application file for complete search history.

(56) References Cited

U.S. PATENT DOCUMENTS

| | | | |
|---|---|---|---|
| 5,061,972 A | 10/1991 | Edmond | |
| 6,642,550 B1* | 11/2003 | Whitworth et al. | 257/99 |
| 7,148,517 B2* | 12/2006 | Tu | H01L 33/0079 257/79 |
| 2001/0020705 A1 | 9/2001 | Miyata | |
| 2005/0168899 A1 | 8/2005 | Sato et al. | |
| 2006/0056123 A1* | 3/2006 | Aoyagi | H01L 25/167 361/56 |
| 2007/0069218 A1* | 3/2007 | Chen | H01L 27/15 257/79 |
| 2009/0267096 A1* | 10/2009 | Kim | H01L 33/0079 257/98 |
| 2010/0301349 A1 | 12/2010 | Wang et al. | |
| 2011/0254046 A1* | 10/2011 | Hsu | H01L 33/385 257/99 |
| 2011/0260205 A1 | 10/2011 | Moosburger et al. | |
| 2012/0018763 A1* | 1/2012 | Engl | H01L 27/15 257/99 |

FOREIGN PATENT DOCUMENTS

| | | | |
|---|---|---|---|
| DE | 10 2009 006 177 A1 | 6/2010 | |
| DE | 10 2009 013 085 A1 | 9/2010 | |
| JP | 63-220583 | 9/1988 | |
| JP | 2001-244506 | 9/2001 | |
| JP | 2006-66863 | 3/2006 | |
| JP | 2006-86300 | 3/2006 | |
| KR | 10-2007-0004737 | 1/2007 | |
| TW | 201029232 A1 | 8/2010 | |
| WO | WO 2010009690 A1 * | 1/2010 | H01L 27/15 |
| WO | 2010/020071 A1 | 2/2010 | |
| WO | 2010/136326 A1 | 12/2010 | |

OTHER PUBLICATIONS

English translation of Japanese Examination Report mailed Jul. 1, 2014 for Chinese Application No. 2013-553867.

English translation of the Korean Notice of Allowance of a Patent dated Jul. 2, 2015 from corresponding Korean Patent Application No. 10-2013-7022886.

Office Action issued Nov. 15, 2014 from corresponding Chinese Patent Application No. 201280009171 along with English translation.

I. Schnitzer et al., "30% external quantum efficiency from surface textured, thin-film light-emitting diodes," Appl. Phys. Lett. 63 (16), Oct. 18, 1993, pp. 2174-2176.

Taiwanese Examination Report mailed Dec. 9, 2013 for Taiwanese Application No. 101104664.

* cited by examiner

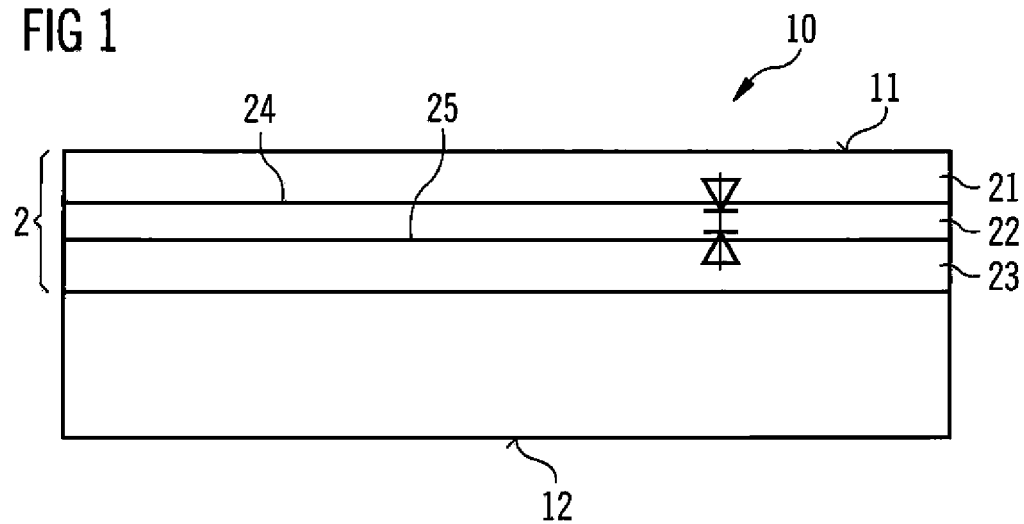
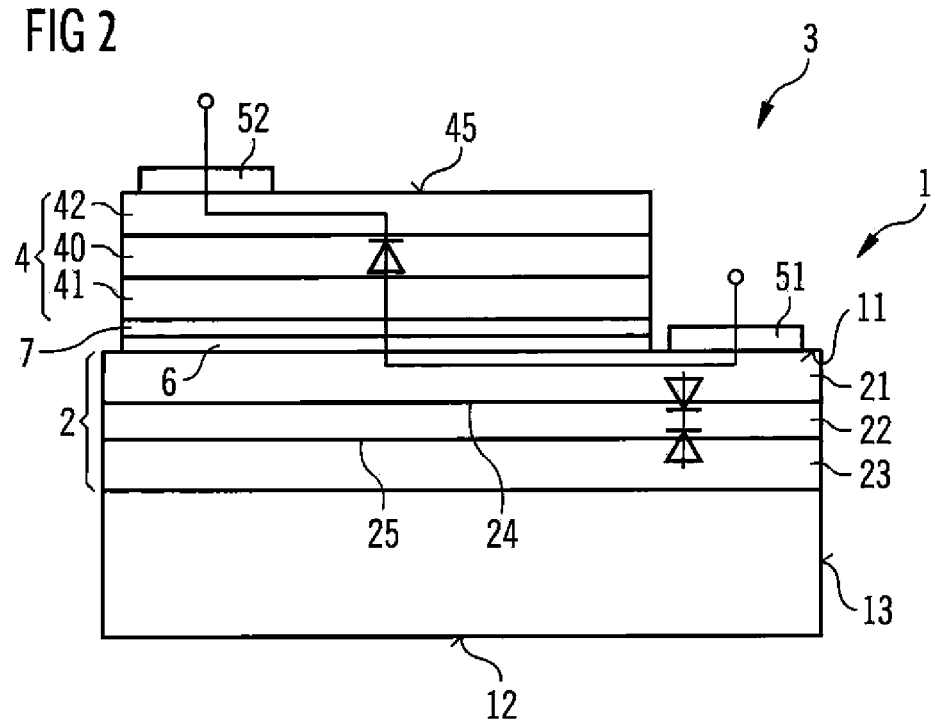

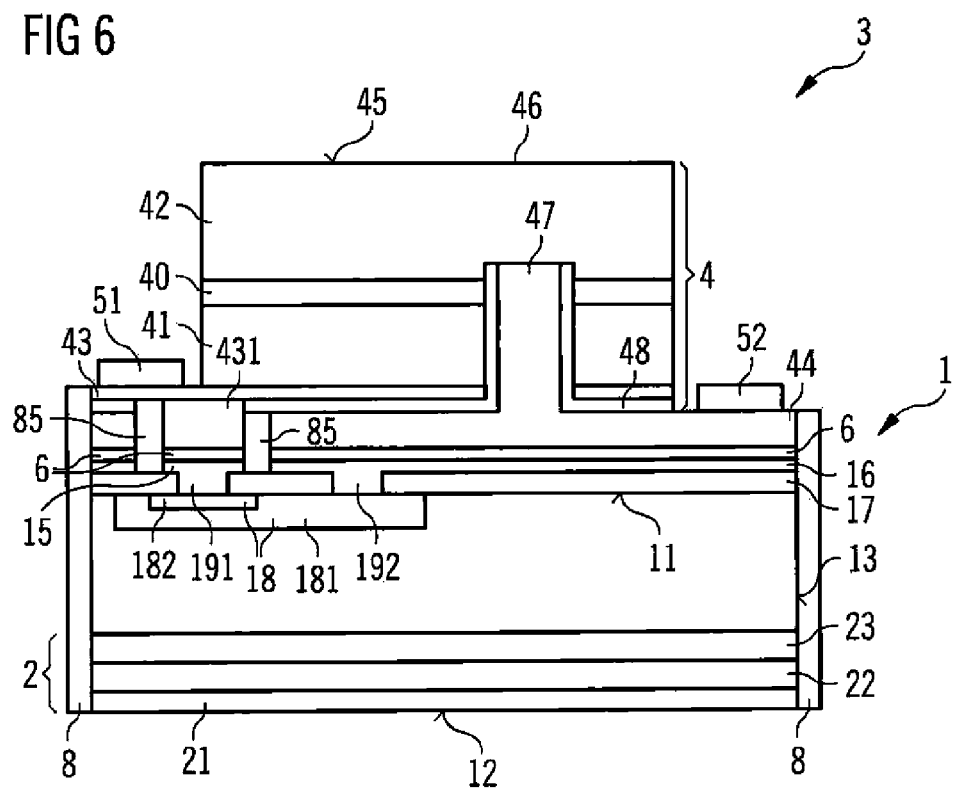

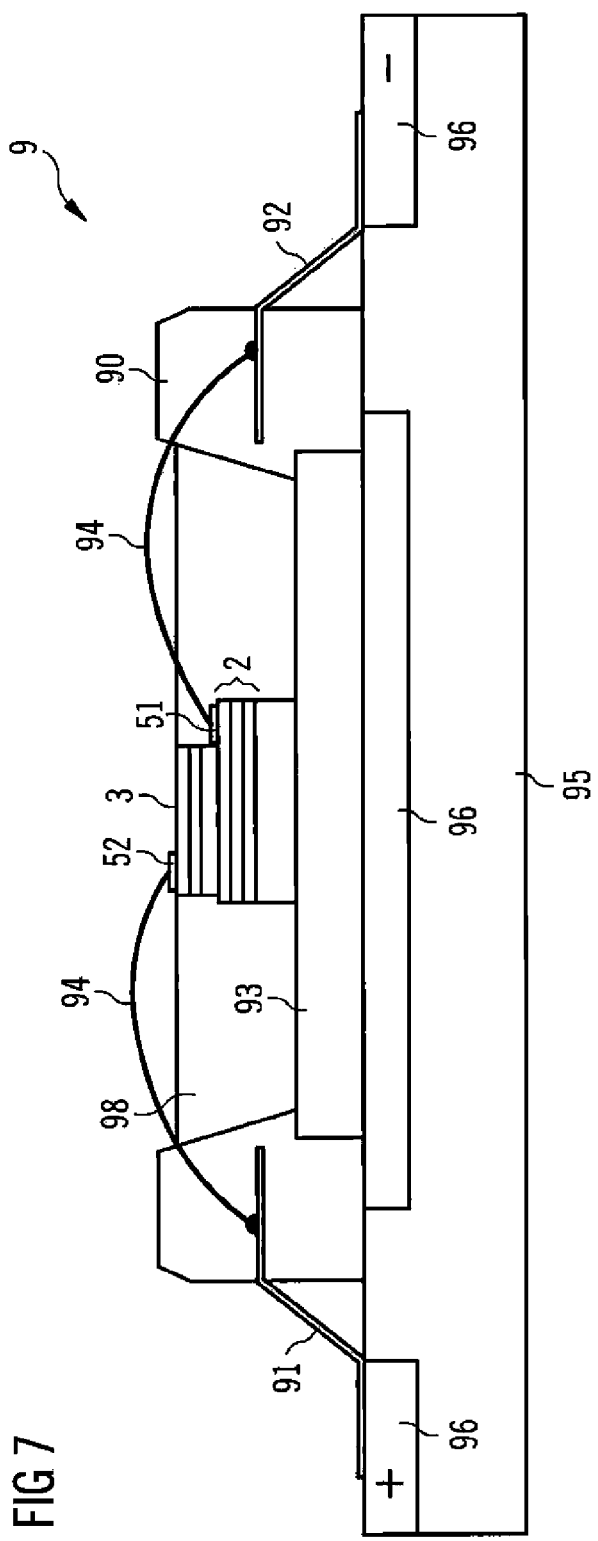

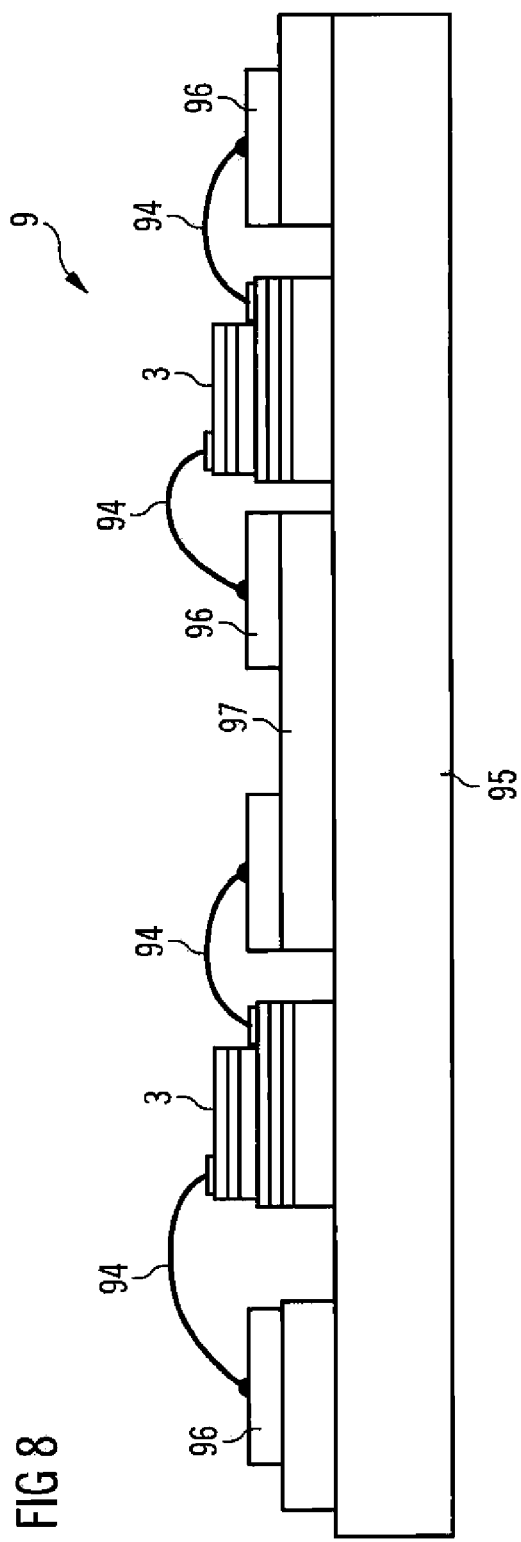

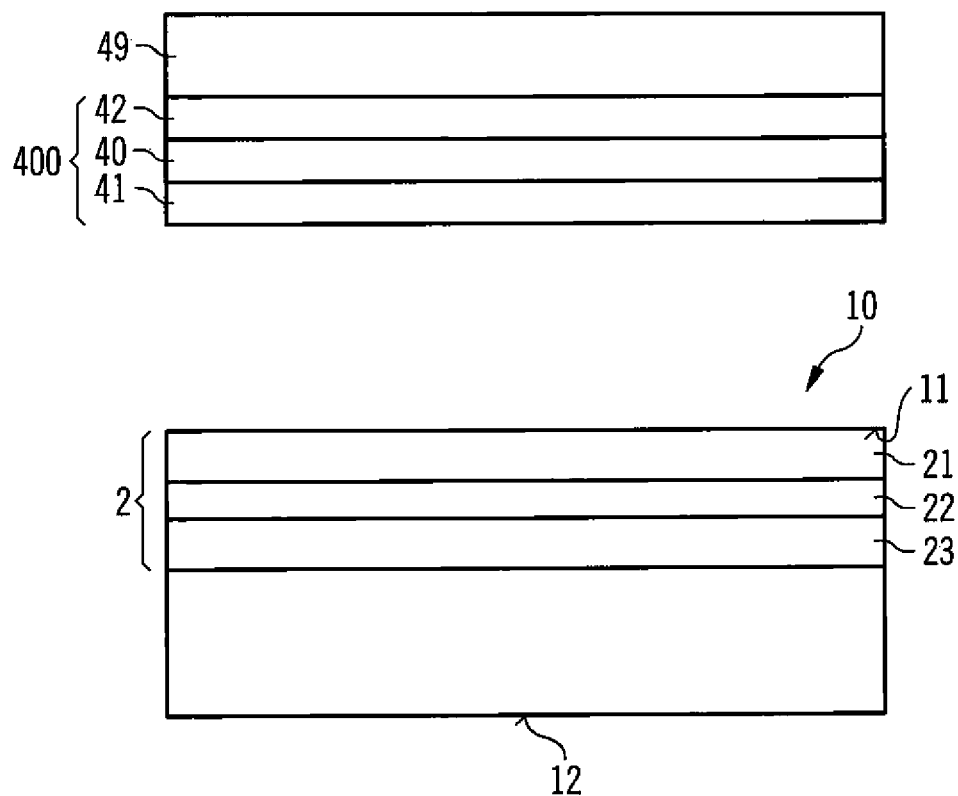

CARRIER SUBSTRATE AND METHOD FOR PRODUCING SEMICONDUCTOR CHIPS

TECHNICAL FIELD

This disclosure relates to a carrier substrate, a semiconductor chip with a carrier formed from a carrier substrate and a method of producing semiconductor chips.

BACKGROUND

In the case of optoelectronic semiconductor chips such as light-emitting diodes, it may be desirable, for example, for the purpose of individual activation, for the radiation-generating region of the semiconductor chips to be electrically insulated from a mounting element to which the semiconductor chips are attached. However, electrical insulators often also exhibit comparatively low thermal conductivity such that arranging such a material between the radiation-generating region and the mounting element hampers efficient dissipation of waste heat generated during operation. This may result in losses in performance and/or a reduced service life.

It could therefore be helpful to provide efficient heat dissipation alongside simultaneous electrical insulation. Furthermore, it could be helpful to provide a method with which efficient semiconductor chips may be simply and reliably produced.

SUMMARY

We provide a carrier substrate for a semiconductor layer sequence including a first major face, a second major face opposite the first major face, and a diode structure formed between the first major face and the second major face, which diode structure electrically insulates the first major face from the second major face at least with regard to one polarity of an electrical voltage.

We also provide a semiconductor chip including a semiconductor body with a semiconductor layer sequence and a carrier with a first major face and a second major face opposite the first major face, the semiconductor body arranged on the first major face of the carrier and a diode structure formed between the first major face and the second major face, which diode structure electrically insulates the first major face from the second major face at least with regard to one polarity of an electrical voltage.

We further provide a method of producing a plurality of semiconductor chips including a) providing a carrier substrate having a first major face and a second major face opposite the first major face, b) forming a diode structure between the first major face and the second major face, the diode structure electrically insulating the first major face from the second major face at least with regard to one polarity of an electrical voltage, c) arranging a semiconductor layer sequence on the first major face of the carrier substrate, and d) singulating the carrier substrate with the semiconductor layer sequence into a plurality of semiconductor chips.

BRIEF DESCRIPTION OF THE DRAWINGS

FIG. 1 is a schematic sectional view of a first example of a carrier substrate.

FIGS. 2, 3 and 4, respectively, show first, second and third examples of a semiconductor chip with a carrier, in each case in schematic sectional view.

FIG. 6 is a schematic sectional view of a fourth example of a semiconductor chip.

FIGS. 7 and 8, respectively, show first and second examples of a component, in schematic sectional view.

FIGS. 9A to 9C show an example of a method of producing a plurality of semiconductor chips by intermediate steps shown schematically in sectional view.

DETAILED DESCRIPTION

Figure 3:
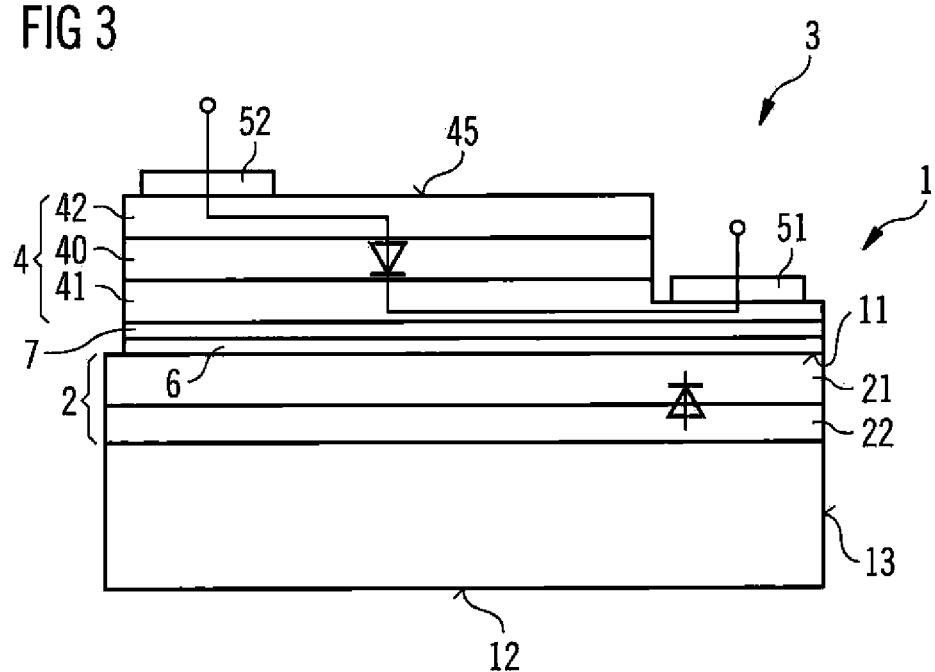

Our carrier substrate for a semiconductor layer sequence may comprise a first major face and a second major face opposite the first major face. A diode structure is formed between the first major face and the second major face, which diode structure electrically insulates the first major face from the second major face at least with regard to one polarity of an electrical voltage.

In other words, electrical current flow in a direction extending perpendicular to the first major face is stopped at least in one direction by the diode structure.

The carrier substrate is conveniently configured such that, between an arbitrary point on the first major face and an arbitrary point on the second major face, at least with regard to one polarity there is no electrical current path through the carrier substrate that connects the points.

The diode structure is preferably formed over the entire area in the carrier substrate, in particular in a plane extending parallel or substantially parallel to the first major face. In plan view onto the carrier substrate the diode structure is thus unpatterned and extends over the entire lateral extent of the carrier substrate.

The carrier substrate is preferably designed such that, during production of a plurality of semiconductor chips, a semiconductor layer sequence is arranged or formed on the carrier substrate, in particular before singulation into semiconductor chips. With the diode structure, a semiconductor layer sequence arranged on the first major face is insulated electrically from the second major face of the carrier substrate.

Preferably, the diode structure insulates the first major face from the second major face with regard to both polarities, in particular over the entire surface. Electrical insulation is thus bidirectional and independent of the polarity of the electrical voltage.

Further preferably, the diode structure comprises a first diode and a second diode. The first diode and the second diode are conveniently arranged vertically one above the other. The first diode and the second diode are preferably oppositely oriented with regard to their conducting direction.

Further preferably, the carrier substrate contains a preferably monocrystalline semiconductor material. Semiconductor materials are distinguished by comparatively high thermal conductivity. Silicon, germanium or gallium arsenide are particularly suitable.

Preferably, the diode structure is formed by layered doping of the carrier substrate. Layers of the carrier substrate are understood in this context to mean generally regions of the carrier substrate arranged vertically one above the other.

The diode structure preferably comprises at least two layers of mutually different conduction type. A pn-junction in the form of a diode is thus simply embodied.

To insulate the first major face electrically from the second major face, the diode structure may in principle be arranged at any point in the vertical direction. The diode structure may thus be spaced vertically from the first major face and/or from the second major face.

Furthermore, one of the doped layers of the diode structure may directly adjoin the first or second major face of the carrier substrate. A doped layer adjoining the first major face may, for example, also be provided for electrical contact.

Preferably, the diode structure comprises at least three successive layers configured alternately with regard to their conduction type, for instance in the form of a pnp or npn layer sequence. This results in two simply realized series-connected pn junctions with mutually opposing conducting directions. The doped layers of the diode structure may adjoin one another directly. By increasing the number of diodes in the vertical direction, it is additionally possible to increase the breakdown field strength in the non-conducting direction.

At least one layer of the carrier substrate may be nominally undoped. In particular, a nominally undoped layer may be arranged between at least two of the doped layers such that these doped layers are spaced from one another.

Preferably, a protection diode is formed in the carrier substrate. The carrier substrate preferably comprises a protection diode in each region provided as a carrier for a semiconductor chip. The protection diode may protect a semiconductor chip with such a carrier from damage due to electrostatic discharge (ESD). The protection diode is preferably arranged between the first major face and the diode structure.

A preferably optoelectronic semiconductor chip may comprise a semiconductor body with a semiconductor layer sequence and a carrier with a first major face and a second major face opposite the first major face. The semiconductor body is arranged on the first major face of the carrier. A diode structure is formed between the first major face and the second major face, which diode structure electrically insulates the first major face from the second major face at least with regard to one polarity of an electrical voltage.

The semiconductor layer sequence preferably comprises an active region intended to generate coherent, partially coherent or incoherent radiation. The semiconductor chip may take the form in particular of a luminescent diode, for instance a light-emitting diode or a laser diode. Alternatively or in addition, the semiconductor chip may also take the form of a radiation receiver.

Heat generated when the semiconductor chip is in operation may be dissipated via the carrier. Furthermore, the active region is electrically insulated by the diode structure from an electrical potential applied to the second major face of the carrier.

The semiconductor layer sequence of the semiconductor body is preferably deposited epitaxially on a growth substrate, for instance by MOCVD or MBE.

The carrier may be the growth substrate for the semiconductor layer sequence.

Alternatively, the carrier is different from the growth substrate. The carrier serves in particular in mechanical stabilization of the semiconductor layer sequence such that the growth substrate is no longer necessary and may be removed.

A semiconductor chip from which the growth substrate has been removed is also referred to as a thin-film semiconductor chip. A thin-film semiconductor chip, in particular a thin-film light-emitting diode chip, is distinguished in particular by the following characteristic features:

a reflective layer is applied to or formed on a first major face, facing the carrier, of a radiation-generating, epitaxial layer sequence, the reflective layer reflecting at least a part of the electromagnetic radiation generated in the epitaxial semiconductor layer sequence back into it;

the epitaxial layer sequence has a thickness in the region of 20 μm or less, in particular in the region of 10 μm; and the epitaxial layer sequence contains at least one semiconductor layer with at least one face which comprises an intermixing structure, which ideally leads to an approximately ergodic distribution of the light in the epitaxial layer sequence, i.e., it exhibits scattering behavior which is as ergodically stochastic as possible.

The basic principle of a thin-film light-emitting diode chip is described, for example, in I. Schnitzer et al., Appl. Phys. Lett. 63 (16), 18 Oct. 1993, 2174-2176, the subject matter of which is hereby incorporated by reference.

A thin-film light-emitting diode chip is a good approximation of a Lambertian surface emitter and therefore particularly suitable for application in a headlight.

The carrier is preferably cohesively bonded to the semiconductor layer sequence. In the case of a cohesively bonded joint, the joint components, which are preferably prefabricated, are held together by atomic and/or molecular forces. A cohesively bonded joint may be achieved, for example, by a bonding layer, for instance an adhesive layer or a solder layer. As a rule, separation of the joint is accompanied by destruction of the bonding layer and/or at least of one of the joint components.

Preferably, one side face of the carrier is provided with a passivation layer. The risk of undesired electrical bypassing of the diode structure, for example, by a solder or an electrically conductive adhesive during mounting of the semiconductor chip, can in this way be avoided. It is also preferable for the passivation layer to be configured to be opaque, in particular absorbent, with regard to electromagnetic radiation, in particular radiation whose energy is above a gap energy of the carrier, for example, radiation in the infrared, visible and/or ultraviolet spectral range. An undesired reduction in the electrical resistance of the diode structure due to radiation-induced photoconduction may thus be prevented or at least reduced. In contrast thereto, the side face of the carrier may be bare, so simplifying production of the carrier.

In a method of producing a plurality of preferably optoelectronic semiconductor chips, a carrier substrate may be provided which has a first major face and a second major face opposite the first major face. A diode structure may be formed between the first major face and the second major face, the diode structure electrically insulating the first major face from the second major face at least with regard to one polarity of an electrical voltage. A semiconductor layer sequence may be arranged on the first major face of the carrier substrate. The carrier substrate with the semiconductor layer sequence may be singulated into a plurality of semiconductor chips. On singulation a carrier for each semiconductor chip is obtained from the carrier substrate, on which carrier a semiconductor body is arranged.

The diode structure may be formed prior to singulation, in particular prior to arrangement of the semiconductor layer sequence. The semiconductor chips thus may already comprise the diode structure when singulation is performed. All the semiconductor chips may thus be simply provided with a diode structure which electrically insulates the semiconductor layer sequence from the second major face of the carrier.

Alternatively, the diode structure is not formed until after singulation. In this case, it is possible to provide with a diode structure only those semiconductor chips in which the semiconductor layer sequence is intended to be electrically insulated from the second major face of the carrier.

Preferably, the diode structure is formed by full-surface doping of the carrier substrate. This may proceed, for example, by alloying, diffusion or implantation. For full-surface doping formation, it may be possible to dispense with, for example, photolithographic masking for lateral patterning.

The semiconductor layer sequence may be deposited on a growth substrate and the growth substrate may be removed after arrangement on the carrier substrate.

Alternatively, the semiconductor layer sequence is deposited epitaxially on the carrier substrate. The carrier substrate thus serves as a growth substrate.

The above-described carrier substrate is particularly suitable for the method. Furthermore, the method is particularly suitable for production of an above-described semiconductor chip. Features listed in connection with the carrier substrate or the semiconductor chip may therefore also be used for the method and vice versa.

Further features, advantageous configurations and convenient aspects are revealed by the following description of examples in conjunction with the Figures.

Identical, similar or identically acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

A first example of a carrier substrate is shown in schematic sectional view in FIG. 1. The carrier substrate 10 extends vertically between a first major face 11 and a second major face 12 extending parallel to the first major face.

A diode structure 2 is formed between the major faces, the diode structure extending laterally over the entire surface of the carrier substrate 10.

The diode structure 2 comprises a first layer 21, a second layer 22 and a third layer 23. The first layer forms the first major face of the carrier substrate. The first layer 21 and the third layer 23 are, for example, each p-conductively doped, while the second layer 22 is n-conductively doped. The pn junctions between these layers respectively form a first diode 24 and a second diode 25. The diodes 24, 25 are oppositely oriented with regard to their conducting direction. The remainder of the carrier substrate 10 may be doped or undoped.

With the diode structure 2, the first major face 11 and the second major face 12 are insulated electrically from one another, the electrical insulation being achieved by the diodes 24, 25 irrespective of the polarity of an applied electrical voltage.

The carrier substrate 10 is preferably based on a semiconductor material, silicon, germanium or gallium arsenide being examples of suitable materials.

In the above-described example, the diode structure is formed by a sequence of directly adjacent layers of alternating conduction type. At variance with this, a nominally undoped layer may also be arranged between at least two doped layers. Moreover, the diode structure may also comprise more than two diodes, which are conveniently interconnected in series.

A first example of a semiconductor chip constructed, for example, as an LED semiconductor chip is shown in schematic sectional view in FIG. 2. The semiconductor chip 3 comprises a carrier 1 obtained during production of the semiconductor chip 3 from a carrier substrate constructed as described in relation to FIG. 1.

The semiconductor chip 3 comprises a semiconductor body 4. A semiconductor layer sequence forming the semiconductor body comprises an active region 40 provided to generate radiation, which is arranged between a first semiconductor layer 41 and a second semiconductor layer 42.

A growth substrate for the epitaxial semiconductor body 4 has been removed and is therefore not shown in FIG. 2. The semiconductor chip 3 is thus formed as a thin-film semiconductor chip, the diode structure 2 being integrated into the carrier 1 of the thin-film semiconductor chip.

The semiconductor body 4 is mechanically and electrically conductively connected by a bonding layer 6, for example, a solder layer or an adhesive layer, with the first major face 11 of the carrier.

When the semiconductor chip 3 is in operation, through the application of an external electrical voltage between a first contact 51 and a second contact 52 of the semiconductor chip 3, charge carriers can be injected from different sides into the active region 40, where they may recombine with the emission of radiation.

The first contact 51 is formed on the first major face 11 of the carrier 2 such that the charge carriers are injected via the first layer 21 of the carrier 1 into the semiconductor body 4. Using the diode structure 2, it is thus possible, despite a current flow through the carrier 1, to achieve electrical insulation relative to the second major face 12 of the carrier.

The carrier 1 is further distinguished by high thermal conductivity, in particular in comparison with a carrier of an electrically insulating material such as sapphire such that, when the semiconductor chip 3 is in operation, waste heat arising in the semiconductor body 4 may be efficiently dissipated from the semiconductor body.

A mirror layer 7 is arranged between the semiconductor body 4 and the carrier 1. The preferably metallic mirror layer is intended to reflect radiation generated in the active region and emitted in the direction of the carrier 1 such that this proportion of the radiation may exit through a radiation exit face 45 of the semiconductor body 4 remote from the carrier 1. In the visible spectral range, silver or aluminium are, for example, suitable for the mirror layer 7, while in the infrared spectral range gold exhibits high reflectivity.

In this example, a side face 13 of the carrier defining the carrier 1 in the lateral direction is bare. Coating of the side face 13 arising on singulation of the carrier substrate is thus not required. To provide protection against undesirable electrical bypassing of the diode structure 2 during mounting of the semiconductor chip 3, it is however in contrast also possible to provide a coating, for example, in the form of a passivation layer.

The second example illustrated in FIG. 3 of a semiconductor chip corresponds substantially to the first example described in connection with FIG. 2. In contrast with the latter, the carrier 1 comprises a diode structure 2 with just one diode. As far as the conducting direction is concerned, the diode is configured such that it is oriented in the non-conducting direction in the event of an operating voltage being applied to the contacts 51, 52. Electrical insulation of the first major face 11 from the second major face 12 of the carrier 1 is thus ensured with regard to one polarity. Furthermore, unlike in the first example the first contact 51 is arranged on the first semiconductor layer 41. Charge carriers may thus be injected by the first contact into the first semiconductor layer independently of the carrier 1.

Figure 4:
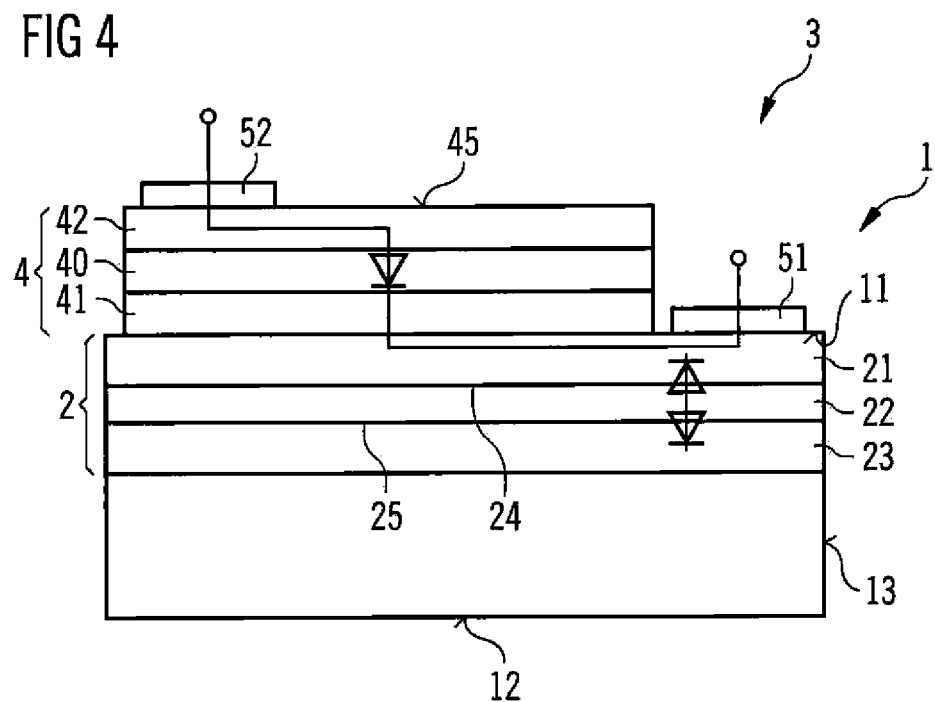

A third example of a semiconductor chip is shown in schematic sectional view in FIG. 4. Unlike in the examples described in relation to FIGS. 2 and 3, the carrier 1 forms the growth substrate for the semiconductor layers of the semiconductor body 4. The semiconductor body is thus not cohesively bonded with the carrier 1, but rather is deposited epitaxially on the carrier. To increase the radiant power exiting from the radiation exit face 45, a mirror may be formed in the semiconductor body 4, for example, in the form of a Bragg mirror (not explicitly illustrated).

Figure 5A:
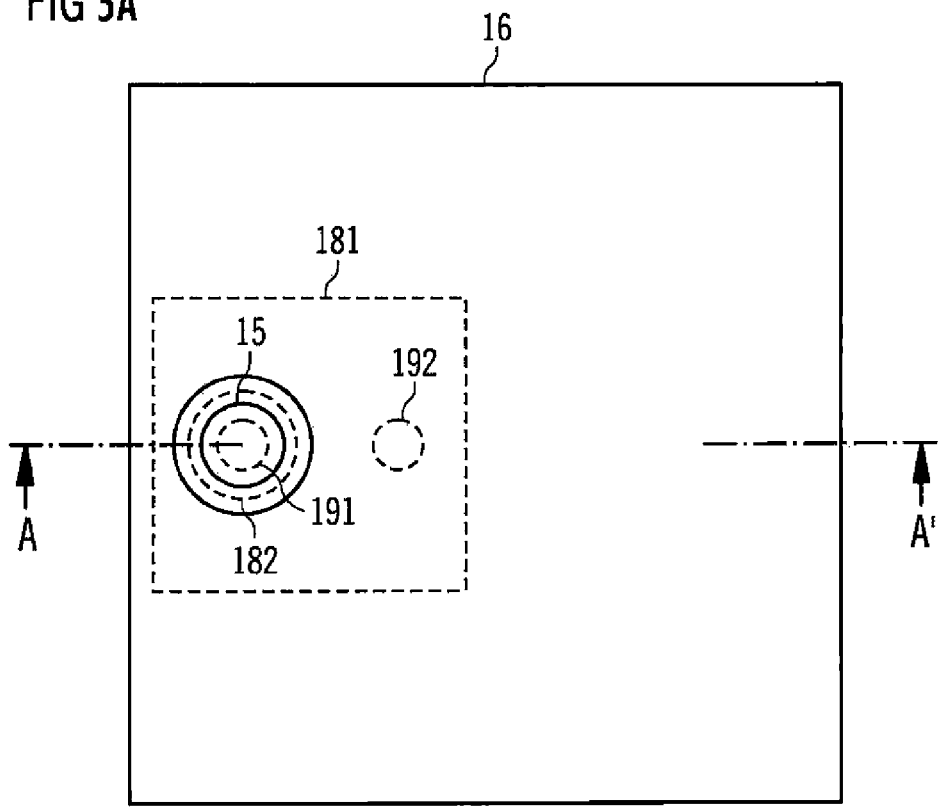
FIGS. 5A and 5B show a portion of a second example of a carrier substrate in schematic plan view (FIG. 5A) and associated sectional view (FIG. 5B).
Figure 5B:
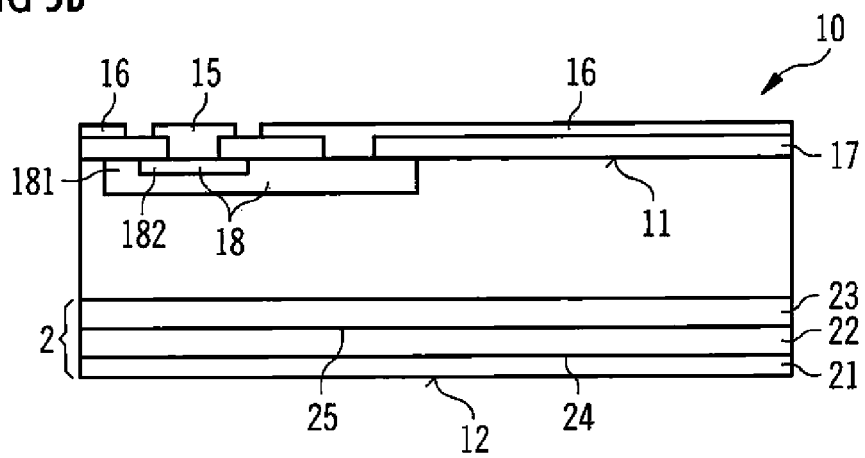

FIGS. 5A and 5B show a portion of a carrier substrate according to a second example. The portion corresponds to a region of the carrier substrate 10 intended as a carrier for a semiconductor body. The carrier substrate conveniently comprises a plurality of such regions, preferably arranged in a matrix.

The carrier substrate 10 comprises a protection diode 18 in addition to the diode structure 2. The protection diode is formed in the carrier substrate 10 between the first major face 11 and the diode structure 2. The protection diode 18 is formed by a first sub-region 181 and of a second sub-region 182. The sub-regions differ from one another with regard to conduction type, thereby resulting in a pn-junction between the sub-regions. The second sub-region 182 is completely surrounded by the first sub-region 181.

An insulation layer 17 is provided on the first major face 11. The insulation layer may, for example, contain an oxide, for instance silicon oxide, a nitride, for instance silicon nitride, or an oxynitride, for instance silicon oxynitride or consist of such a material. The insulation layer 17 comprises a first opening 191 and a second opening 192. In plan view onto the carrier substrate 10, the first opening 191 overlaps with the first sub-region 181 and the second opening 192 overlaps with the second sub-region 182. A first land 15 and a second land 16 are arranged on the insulation layer, the lands being connected electrically conductively through the openings with the second sub-region 182 and the first sub-region 181 respectively.

The diode structure 2 adjoins the second major face 12 of the carrier substrate 10. In contrast thereto, the diode structure may however also be spaced from the second major face.

An example of a semiconductor chip in which the carrier is formed from a carrier substrate according to the example described in relation to FIGS. 5A and 5B is shown in FIG. 6. As described in relation to FIG. 2, the semiconductor body 4 is attached to the carrier 1 using a bonding layer 6. The semiconductor body 4 comprises a recess 47 which extends from the carrier 1 through the first semiconductor layer 41 and the active region 40 into the second semiconductor layer 42. To prevent an electrical short circuit of the active region 40, a side face of the recess 47 is covered by an insulation layer 48. Between the semiconductor body 4 and the carrier 1 is arranged a first terminal layer 43 which adjoins the first semiconductor layer 41 facing the carrier and connects electrically conductively therewith. A first contact 51 of the semiconductor chip 3 is arranged on the first terminal layer 43. The second semiconductor layer 42 connects electrically conductively with a second terminal layer 44 which extends through the recess 47.

The first terminal layer 43 extends in places between the semiconductor body 4 and the second terminal layer 44. The insulation layer 48 is provided between the terminal layers 43, 44 to prevent an electrical short circuit. A second contact 52 is provided on the second terminal layer 44. The semiconductor chip 3 is thus electrically contacted by two contacts 51, 52 spaced laterally from the semiconductor body 4. The radiation exit face 45 of the semiconductor body is free of electrical contacts, thereby preventing shading of the radiation exit face.

To increase the outcoupled radiant power, the radiation exit face 45 is provided with patterning 46, for example, roughening.

The contacts 51, 52 are additionally connected to the protection diode 18. The active region 40 and the protection diode 18 are interconnected in antiparallel with regard to their conducting direction. The second semiconductor layer 42 adjoining the second contact 52 may, for example, be n-conductive and the first sub-region 181 p-conductive or vice versa. In the event of a voltage being applied in the non-conducting direction relative to the active region 40, charge carriers may flow away via the protection diode. A protection diode is thus incorporated into the semiconductor chip 3, in particular into the carrier 1, as part of the semiconductor chip, which protection diode protects the semiconductor body from damage by electrostatic discharge.

The first contact 51 connects via the first terminal layer 43, the bonding layer 6 and the first land 15 to the second sub-region 182 of the protection diode 18. The second contact 52 connects via the second terminal layer 44, the bonding layer 6 and the second land 16 electrically conductively with the first sub-region 181 of the protection diode 18. To prevent an electrical short circuit, a space 85 is formed between a sublayer 431 connected to the first terminal layer 43 and the second terminal layer 44.

The side faces 13 of the carrier 1 are provided with a passivation layer 8. The risk of the diode structure 2 experiencing an electrical short circuit during mounting of the semiconductor chip 3, for example, by a solder or an electrically conductive adhesive, is thus reduced. The passivation layer is moreover radiation-opaque, in particular absorbent, such that a reduction in the electrical resistance of the diode structure 2 due to radiation-induced photoconduction may be avoided or at least reduced. One of the materials mentioned in connection with the insulation layer 17 is in particular suitable for the passivation layer, for example, silicon nitride may exhibit comparatively low transmission for radiation in the ultraviolet and visible spectral ranges. It goes without saying that the passivation layer 8 may also be provided in a semiconductor chip according to the other examples described.

A first example of a component is shown in schematic sectional view in FIG. 7. The semiconductor chip 3 of the component 9 may be configured in particular as described in connection with the above-described.

The surface-mountable component (surface mounted device, SMD) 9 comprises a package body 90, enclosing a lead frame with a first terminal conductor 91 and a second terminal conductor 92. The package body may, for example, take the form of a plastics molding.

The package body 90 further encloses a thermal terminal conductor 93. The thermal terminal conductor 93 may, for example, contain a metal, for instance copper. The semiconductor chip 3 is mounted on the thermal terminal conductor. The contacts 51, 52 of the semiconductor chip 3 connect electrically conductively with the terminal conductors 91, 92 via connecting leads 94, for instance wire bond connections. As alternatives to wire bond connections, contacting methods may also be used which use, for example, solder bumps, vias, a planar, layered contact structure or "castellations."

The semiconductor chip 3 is surrounded laterally by a conveniently electrically insulating reflector layer 98, consisting, for example, of a plastic, for instance an epoxide or a silicone, provided with reflective particles, for instance titanium oxide particles. The radiant power exiting overall from the radiation exit face 45 of the semiconductor chip may be increased to a greater extent thereby. Furthermore, the reflector layer prevents photons coupled into the carrier 1 from outside the semiconductor chip from increasing conductivity in the diode structure 2 and so impairing electrical insulation provided by the diode structure.

The package body 90 is arranged on a mounting board 95 which comprises terminal regions 96. The mounting board may take the form, for example, of a printed circuit board (PCB) or of a metal core printed circuit board (MCPCB).

The terminal conductors 91, 92 each electrically conductively connect to a terminal area 96. Furthermore, the thermal terminal conductor 93 may also be connected to a terminal area. Power dissipation to the surroundings may be improved thereby. Unlike the terminal conductors 91, 92, the thermal terminal conductor 93 and the terminal area adjoining it do not however serve in electrical contacting of the semiconductor chip 3, but rather in efficient heat dissipation from the semiconductor chip. The active region of the semiconductor chip 3 provided to generate radiation is electrically insulated from the mounting board 95 by the diode structure 2.

A second example of a component is illustrated schematically in sectional view in FIG. 8. Unlike in the first example, the component 9 takes the form of a module in which a plurality of semiconductor chips 3 are mounted unpackaged on the mounting board 95.

To insulate the terminal areas 96 electrically, an insulation layer 97 is provided between the mounting board 95 and the terminal areas 96. The insulation layer 97 ensures that the semiconductor chips 3 can be individually contacted electrically even in the case of an electrically conductive mounting board, for example, a metal board. In contrast thereto, the semiconductor chips may at least in part be interconnected electrically, for example, in parallel connection or in series connection.

The semiconductor chips 3 may, on the other hand, be attached directly to the mounting board 95, since electrical insulation of the active regions of the semiconductor chips is ensured by the diode structure 2 of the semiconductor chips. It is thus possible to dispense with an insulation layer between the semiconductor chip and the mounting board such that heat resistance is reduced and heat dissipation from the semiconductor chip thus improved.

Figure 9B:
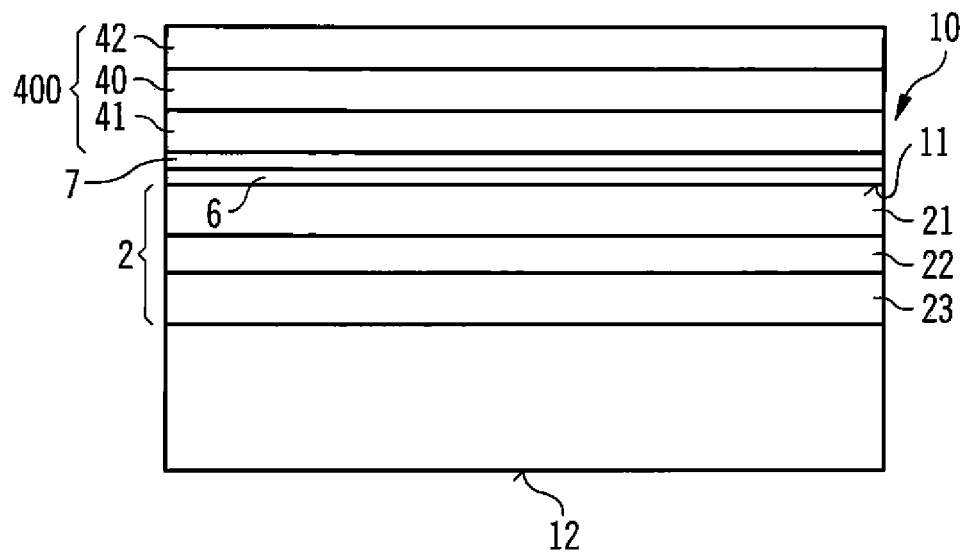
Figure 9C:
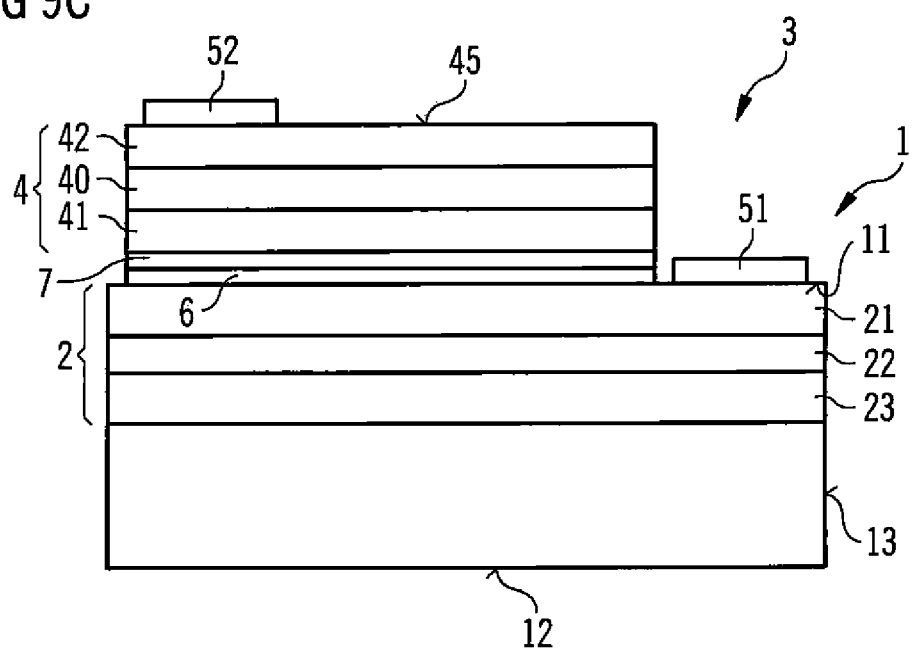

One example of a method of producing semiconductor chips is shown in FIGS. 9A to 9C by way of intermediate steps illustrated schematically and in sectional view, a semiconductor chip being produced by way of example which is as described in relation to FIG. 2.

As illustrated in FIG. 9A, a carrier substrate 10 is provided, which has a diode structure 2. To simplify the illustration, only one region of the carrier substrate 10 is shown, from which precisely one carrier for a semiconductor chip is obtained during production.

A semiconductor layer sequence 400 with an active region 40 that generates radiation arranged between a first semiconductor layer 41 and a second semiconductor layer 42 is deposited epitaxially on a growth substrate 49, for example, by MOVPE or MBE.

The diode structure 2 is formed by full-surface doping of the carrier substrate 10. The doped layers of the carrier substrate 10 may be produced, for example, by alloying, diffusion and/or implantation.

As shown in FIG. 9B, the semiconductor layer sequence 400 is stably mechanically bonded to the carrier substrate 10 by a bonding layer 6. After attachment, the carrier substrate serves to mechanically stabilize the semiconductor layer sequence such that the growth substrate for the semiconductor layer sequence may be removed. This may be carried out, for example, by coherent radiation, for instance using a laser lift-off method, mechanically, for instance by grinding, lapping or polishing, or chemically, for instance by wet chemical or dry chemical etching.

For electrical contact of the first semiconductor layer 41, the semiconductor layer sequence is removed in places, thereby exposing the first major face 11 of the carrier substrate 10. The electrical contacts 51, 52 may be applied, for example, by vapor deposition or sputtering.

To singulate semiconductor chips, the semiconductor layer sequence 400 is subdivided together with the carrier substrate 10 such that semiconductor chips 3 are obtained which each comprise one semiconductor body 4 and one carrier 1. Singulation may proceed, for example, by coherent radiation, for instance by a laser separation method, mechanically, for instance by sawing, breaking or splitting, or chemically, for instance by wet chemical or dry chemical etching. FIG. 9C shows a finished semiconductor chip.

Unlike in the example described, formation of the diode structure 2 may also be left until after the semiconductor layer sequence 400 has been arranged on the carrier substrate 10. In particular, formation of the diode structure may also take place only after singulation into semiconductor chips. In this way, the diode structure may be formed just in those semiconductor chips in which the semiconductor body 4 is intended to be electrically insulated from the second major face 12 of the carrier 1. Furthermore, the carrier substrate 10 may also serve as a growth substrate for the semiconductor layer sequence 400. In this case, it is possible to dispense with transfer to a carrier other than the growth substrate.

With the above-described method, the semiconductor bodies 4 of the semiconductor chips may be insulated electrically from a mounting surface for the semiconductor chips by formation of the diode structure, without heat resistance being increased significantly since, for example, the electrically insulating depletion zone in a pn-junction brings about only a slightly reduction in thermal conductivity.

Our substrates and methods are not restricted by the description given with reference to the examples. Rather, this disclosure encompasses any novel feature and any combination of features, including in particular any combination of features in the appended claims, even if the feature or combination is not itself explicitly indicated in the claims or the examples.

The invention claimed is:

1. A semiconductor chip comprising a semiconductor body with a semiconductor layer sequence and a carrier with a first major face and a second major face opposite the first major face, the semiconductor body arranged on the first major face and a diode structure formed between the first major face and the second major face, wherein the diode structure electrically insulates the first major face from the second major face at least with regard to one polarity of an electrical voltage, the diode structure extends over an entire lateral extent of the carrier;

the semiconductor layer sequence comprises an active region that generates radiation;

the active region is electrically insulated from the second major face by the diode structure, the semiconductor body comprises a radiation exit face facing away from the carrier, the entire radiation exit face is free of electrical contacts, the semiconductor body is cohesively bonded to the carrier by a bonding layer arranged between the first major face and the semiconductor body, and a protection diode is formed in the carrier and arranged between the first major face and the diode structure.

2. The semiconductor chip according to claim 1, wherein the diode structure electrically insulates the first major face from the second major face with regard to both polarities.

3. The semiconductor chip according to claim 1, wherein the diode structure comprises a first diode and a second diode, the first diode and the second diode being oppositely oriented with regard to their conducting direction.

4. The semiconductor chip according to claim 1, wherein the carrier contains a semiconductor material.

5. The semiconductor chip according to claim 1, wherein the diode structure is formed by layered doping of the carrier.

6. The semiconductor chip according to claim 1, wherein the diode structure comprises at least three successive layers configured alternately with regard to their conduction type.

7. The semiconductor chip according to claim 1, wherein the carrier is cohesively bonded to the semiconductor layer sequence.

8. The semiconductor chip according to claim 1, wherein a side face of the carrier is provided with a passivation layer.

9. The semiconductor chip according to claim 1, further comprising a first contact and a second contact arranged on a side of the carrier facing away from the second major face and adapted to receive an external electrical voltage.

10. The semiconductor chip according to claim 9, wherein the first contact, the second contact and the semiconductor body are arranged side by side on the carrier.

11. The semiconductor chip according to claim 1, wherein an insulation layer is arranged on the first major surface;

the protection diode comprises a first sub-region and a second sub-region that differ from one another with regard to conduction type;

the insulation layer comprises a first opening and a second opening; and the first opening overlaps the first sub-region and the second opening overlaps the second sub-region.

12. A semiconductor chip comprising a semiconductor body with a semiconductor layer sequence and a carrier, a first major face, a second major face opposite the first major face and a side face provided with a radiation-opaque passivation layer, the semiconductor body arranged on the first major face and a diode structure formed between the first major face and the second major face, wherein the diode structure electrically insulates the first major face from the second major face at least with regard to one polarity of an electrical voltage, the side face is an outer side face of the carrier delimiting the extent of the carrier in a lateral direction and the radiation-opaque layer completely covers the side face, the diode structure extends over an entire lateral extent of the carrier;

the semiconductor layer sequence comprises an active region that generates radiation;

the active region is electrically insulated from the second major face by the diode structure;

a protection diode is formed in the carrier and arranged between the first major face and the diode structure;

the protection diode is formed by a first sub-region and a second sub-region that differ from one another with regard to conduction type;

in a plan view of the semiconductor chip, the second sub-region is completely surrounded by the first sub-region; and the first sub-region has a smaller lateral extent than the diode structure.

13. The semiconductor chip according to claim 12, wherein the active region and the protection diode are interconnected in antiparallel with regard to their conducting direction.

* * * * *